United States Patent [19]

Eguchi et al.

[11] 4,343,960
[45] Aug. 10, 1982

[54] THERMOPILE AND PROCESS FOR MANUFACTURING SAME

[75] Inventors: Kazuo Eguchi, Ibaraki; Tadashi Kobayashi, Gifu; Yukiharu Miyake, Tama, all of Japan

[73] Assignees: Building Research Institute, Ministry of Construction; Ryoko Electronic Industries Ltd.; Eko Instruments Trading Co., Ltd., all of Tokyo, Japan

[21] Appl. No.: 206,257

[22] Filed: Nov. 12, 1980

[30] Foreign Application Priority Data

Nov. 20, 1979 [JP] Japan .................. 54-149464

[51] Int. Cl.³ ............................. H01L 35/28
[52] U.S. Cl. ...................... 136/225; 29/573; 136/236 R; 136/241
[58] Field of Search .............. 29/573; 136/211, 212, 136/224, 225, 226, 227, 236 R, 241

[56] References Cited

U.S. PATENT DOCUMENTS

| | | | |
|---|---|---|---|
| 3,509,624 | 5/1970 | Boucher | 29/573 |
| 3,626,624 | 12/1971 | Abbott et al. | 136/211 |
| 4,029,521 | 6/1977 | Korn et al. | 136/225 |
| 4,050,302 | 9/1977 | Haupin | 136/225 X |
| 4,111,717 | 9/1978 | Baxter | 136/225 |
| 4,276,441 | 6/1981 | Wilson | 136/225 |

Primary Examiner—Leland A. Sebastian
Attorney, Agent, or Firm—Brumbaugh, Graves, Donohue & Raymond

[57] ABSTRACT

An improved thermopile is provided. A plurality of thermocouples constituting the thermopile are composed of segments of one metal and segments of the other metal, and the segments of different metals are connected to one another alternately so that the thermocouples are arranged in series on a heat-resistant, electrically non-conductive substrate. Each segment has a portion plated on one surface of the substrate, a portion plated on the other surface of the substrate and a portion plated on the inner wall of through holes formed in the substrate to connect the two portions plated on the two surfaces of the substrate with each other. The thermopile is prepared advantageously by utilizing plating and photo-etching techniques.

6 Claims, 22 Drawing Figures

THERMOPILE AND PROCESS FOR MANUFACTURING SAME

BACKGROUND OF THE INVENTION (1) Field of the Invention

This invention relates to a thermopile for a heat flow meter and a process for manufacturing thereof. More particularly, it relates to a thermopile having good quality, which contains metal segments supported on a substrate, and to a process for manufacturing this thermopile at a high efficiency by utilizing plating and photo-etching techniques.

(2) Description of the Prior Art

A thermometer utilizing a thermoelectromotive force is ordinarily called a "thermoelectric thermometer" and is in common use in various fields. A thermoelectric thermometer is composed of thermocouples which in turn are composed of lines of different metals, such as copper and constantan formed in a closed circuit. In order to measure the temperature, one connection point of the circuit is maintained at 0° C. or room temperature while the other connection point is attached to the material, the temperature of which is to be measured. The temperature difference between the two connection points is measured by detecting a thermoelectromotive force generated by this temperature difference. Various combinations of metals are used for these thermocouples. Good results are obtained when this temperature difference is large. However, when the temperature difference between the two connection points is slight, the thermoelectromotive force generated in these thermocouples is small and it is difficult or even impossible to measure the temperature of the material.

In order to overcome this difficulty in measurement, a thermopile, an apparatus consisting of a number of thermocouples combined so as to multiply electric currents, is utilized. Most conventional thermopiles are prepared by winding metal wires or metal foils on a heat-resistant substrate or embedding metal wires or metal foils in a heat-resistant substrate. However the conventional process for manufacturing such thermopiles is complicated and its productivity is very low. Moreover, the stability in the performances of the products is not satisfactory.

SUMMARY OF THE INVENTION

This invention is directed to a thermopile which facilitates the measurement of thermoelectromotive force even when the temperature difference is slight.

The object of the invention is achieved through the use of a plurality of thermocouples composed of segments of one metal and segments of a second metal connected to one another alternately, so that the thermocouples are arranged in series on a substrate. Such a thermopile has good quality and the process has high productivity while enhancing the reliability by plating and photo-etching techniques.

An illustrative embodiment of the invention is directed to a thermopile comprising a plurality of thermocouples composed of segments of one metal and segments of a second metal, said segments of different metals being connected to one another alternately so that the thermocouples are arranged in series on a heat-resistant, electrically non-conductive substrate, wherein each segment comprises a portion plated on one surface of the substrate, a portion plated on the other surface of the substrate and a portion plated on the inner wall of through holes formed in the substrate to connect the two portions plated on the two surfaces of the substrate with each other. Pattern and density of the thermocouples can optionally be changed. The through holes are preferably arranged in checker-like pattern in the substrate. According to this invention, a through hole is defined as a hole which extends from one side of the substrate to the other side of the substrate.

Second and third illustrative embodiments of the invention are directed to a process for preparing the thermopile. Utilization of one embodiment over another embodiment depends on the intended use of the thermocouple. In the second illustrative embodiment, the process for manufacturing a thermopile consists of:

(a) forming a plurality of through holes in a heat-resistant, electrically non-conductive substrate at predetermined positions;

(b) subjecting the inner walls of said through holes and both the surfaces of the substrate to electroless plating;

(c) plating the entire surface of said electroless plating layer with a first metal;

(d) forming on the plating layer of the first metal a plating resist covering the plating layer of the first metal except regions corresponding to the portions of the segments of the second metal to be formed thereon and to the openings of the plated through holes opening in said portions;

(e) plating the resist-formed substrate with the second metal by using the plating resist as a mask;

(f) removing the plating resist;

(g) forming on the composite plating layer of the two metals an etching resist covering only regions corresponding to the portions of the segments of the two metals to be formed on the surfaces of the substrate and to the openings of the plated through holes opening in said portions;

(h) performing etching by using the etching resist as a mask; and, (i) removing the etching resist.

In the third illustrative embodiment, the process for manufacturing the thermopile, specified above, consists of:

(a) forming a plurality of through holes in a heat-resistant, electrically non-conductive substrate at predetermined positions;

(b) subjecting the inner walls of said through holes and both the surfaces of the substrate to electroless plating;

(c) plating the entire surface of said electroless plating layer with a first metal;

(d) plating the entire surface of the first metal plating layer with the second metal;

(e) forming on the composite plating layer of the two metals a first etching resist covering only regions corresponding to the portions of the segments of the two metals to be formed on the surfaces of the substrate and to the openings of the plated through holes opening in said portions;

(f) performing etching by using the first etching resist as a mask;

(g) removing the first etching resist;

(h) forming on the remaining composite plating layer a second etching resist covering regions corresponding to the portions of the segments of the second metal to be formed on the surfaces of the substrate and to the openings of the plated through holes opening in said portions;

(i) performing etching by using the second etching resist as a mask to expose the first metal at predetermined positions; and, (j) removing the second etching resist.

The mechanical strength and the precision of the thermopile produced in the second and third illustrative embodiments are remarkably enhanced because plating layers of metals are formed on the substrate and relatively homogenous plating layers can be formed, respectively.

BRIEF DESCRIPTION OF THE DRAWINGS

The foregoing and other features of the invention will be more readily apparent from the following detailed description and drawings of illustrative embodiments of the invention in which.

DESCRIPTION OF THE EXEMPLARY EMBODIMENTS

Figure 1:
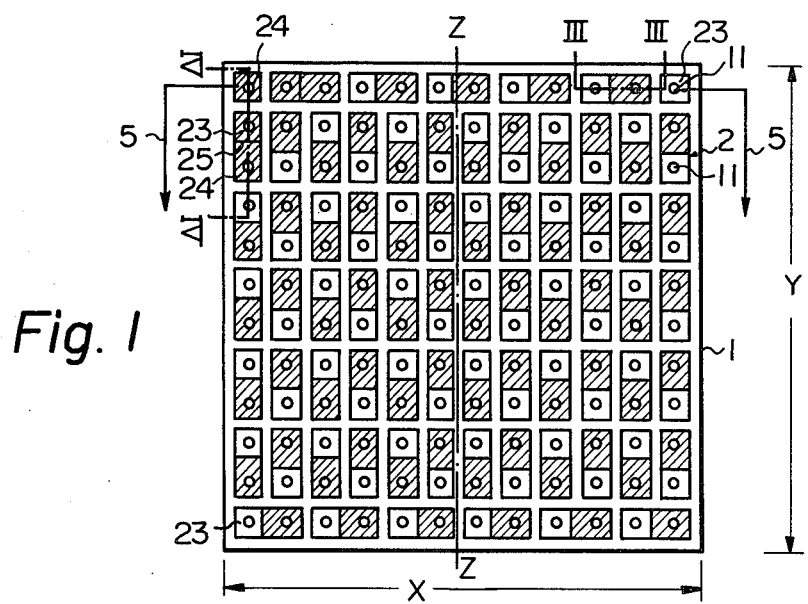
FIG. 1 is a top plan view of an illustrative embodiment of the thermopile according to the invention.
Figure 2:
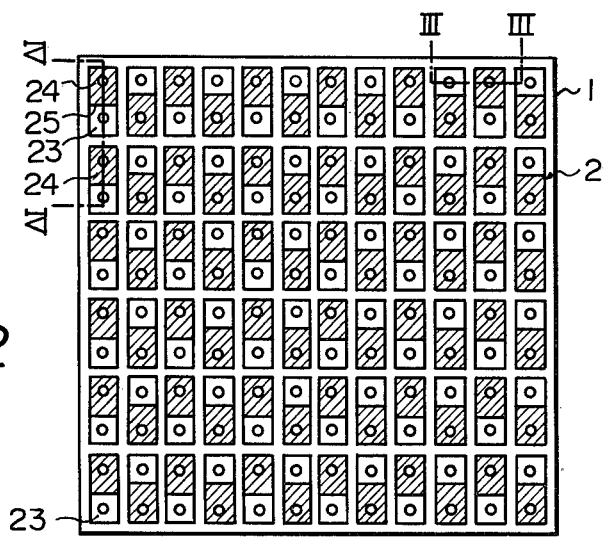
FIG. 2 is a back plan view of the thermopile shown in FIG. 1.
Figure 3:
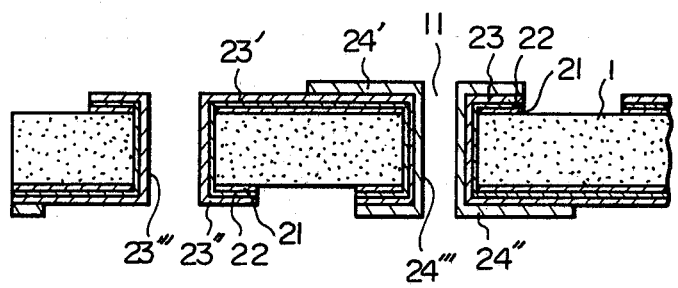
FIG. 3 is an enlarged end view showing the section taken along the line III—III in FIG. 1.

In FIGS. 1 and 2, the thermopile of this invention comprises a plurality of thermocouples 2 which are composed of segments 23 of one metal and segments 24 of a second metal. The segments 23 and 24 of different metals are connected to one another alternately so that the thermocouples 2 are arranged in series on a substrate 1. In FIG. 3, the segment 23 of one metal contains a portion 23' plated on one surface of the substrate 1, a portion 23" plated on the other surface of the substrate and a portion 23''' plated on the inner wall of a through hole 11 formed in the substrate 1 to connect these portions 23' and 23" with each other. Segment 24 of the other metal also comprises a portion 24', 24" and 24''' as in the case of segment 23. It is preferred that a large number of through holes 11 be formed in the surfaces of the substrate 1 in a checker-like pattern and the segments 23 and 24 be connected to one another alternately so that they form a zigzag pattern in the surface of the substrate 1. In the preferred embodiment illustrated in FIGS. 1 and 2, the segment 24 located on the left end and the upper end in the drawings is connected to the segment 23 just below said segment 24. An abutting line 25 between the two segments 24 and 23, which can be seen from the outside, appears on the back face of the substrate 1 (see FIG. 2). This segment 23 is connected to another segment 24 located just below said segment 23, and an abutting line 25 between the two segments, which can be seen from the outside, appears on the front surfaces of the substrate (see FIG. 1). Such connection is repeatedly formed until the connection reaches the segment 23 located on the left end and the lower end of the substrate, and this segment 23 is connected to the segment 24 located just on the right side of said segment 23. Then, the segment-connecting line rises in the surfaces of the substrate 1 in the direction of Y. In this manner, a large number of the segments 23 and 24 are connected to one another alternately so that they rise or fall in the direction of Y in the surfaces of the substrate 1 and they form a zigzag pattern in the direction of X, and finally, the connection reaches the segment 23 located on the right and the upper end of the substrate. This arrangement of the segments is advantageous in that the segment-supported substrate can be divided into two thermopiles by cutting the substrate in the direction of Y at an appropriate position, for example, along the line Z—Z in FIG. 1. The segments located on the extremity ends are connected to terminals of a voltmeter (not shown) through lead lines 5.

The substrate 1 should be heat-resistant and electrically non-conductive. Furthermore, the substrate 1 should have a sufficient mechanical strength so that the substrate 1 can act as a stress-supporting member of the thermopile. As the substrate satisfying these requirements, those are suitably used which are obtained by forming a prepreg by impregnating a fibrous sheet with a heat-resistant, electrically non-conductive thermosetting resin, laminating such prepregs if necessary and then curing the thermosetting resin. For example, the substrate includes a glass fiber-reinforced epoxy resin plate, a laminate of such plates, a glass fiber-reinforced unsaturated polyester resin plate, a laminate of such plates, a paper-phenolic resin laminate plate and the like. A copper-lined laminate plate having the surfaces clad with copper foils can also be used as the substrate 1. The substrate 1 is ordinarily used in the form of a plate having a thickness of from about 1 mm to several mm. Of course, a thinner substrate, such as a sheet or film, may be used.

Combination of metals are utilized in the thermocouple unit, for example, nickel-copper, silver-nickel, copper-constantan, iron-constantan and iron-nickel. The preferred combination of metals is nickel-copper. It is preferred that the combination of metals be plated in a single layer. However, because of plating procedures, a primary layer of a different metal may be formed. In order to minimize the influences of the different metal forming the primary layer, it is preferred that either the thickness of the primary layer of the different metal be reduced as much as possible or the thickness of the top surface plating metal layer be increased.

FIG. 5 illustrate the manufacturing of thermopile at a high productivity and with high reliability by utilizing plating and photo-etching techniques. In FIG. 5A, through holes 11 having a diameter of 0.7 mm are formed in a glass fiber-reinforced epoxy resin plate substrate 1 of 1.6 mm in thickness having copper foils 21 formed on the two surfaces of the substrate. Then, the substrate 1 is subjected to electroless plating to form an electroless copper plating layer 22 on the entire surface of the substrate 1 inclusive of the inner walls of the through holes 11 (see FIG. 5B). It is preferable that the electroless copper plating follow a known preliminary treatment steps such as a degreasing step and/or a catalyzing step. Although electroless copper plating is ordinarily adopted at this step, electroless nickel plating may be adopted. Subsequently, a plating layer 23 of nickel as one metal is formed on the electroless copper plating layer 22 (see FIG. 5C). A preliminary treatment of substrate 1 with a sulfuric acid precedes the substrate 1 being dipped in a plating solution comprising, for example, nickel sulfamate as the main ingredient, to effect nickel plating. Then, a plating resist 3 is formed for forming the plating layer of the other metal, that is, copper, only at predetermined positions. For example, a photosensitive resin "Liston" ® manufactured and sold by DuPont may be used as the plating resist. As illustrated in FIG. 5D, this plating resist 3 is applied so as to cover the regions where copper plating is not desired. In order to achieve this purpose, a photosensitive resin film or gelatin film is applied to both surfaces of the substrate as illustrated in FIG. 5C, a photographic film having a desired pattern is placed thereon, the assembly is exposed to actinic rays, and then the unexposed areas are dissolved out by using an organic solvent such as trichloroethane. Accordingly, the plating resist 3 in FIG. 5D is an exposed and cured film having a pattern corresponding to the pattern of the photographic film. The substrate in this state is subjected to preliminary treatments such as degreasing treatment, ammonium sulfate treatment and sulfuric acid treatment and is then dipped in a plating solution of the copper pyrophosphate or copper sulfate type to effect electroplating with copper. Hence, a copper plating layer 24 is formed on the region where the nickel plating layer 23 is exposed, as illustrated in FIG. 5E. Then, the plating resist 3 formed at the step illustrated in FIG. 5D is removed by an organic solvent, for example, methylene dichloride (see FIG. 5F). Unnecessary portions of the two metals are then removed by etching. For example, after an etching resist 4 similar to the above-mentioned plating resist 3 is formed as illustrated in FIG. 5G so as to cover the regions corresponding to the portions, removal of which by etching is not desired, etching is carried out by using an appropriate etching solution, for example, a solution of ferric chloride, whereby the metals in the regions where the etching resist is not present are dissolved out, and discontinuous portions 10 are formed on the substrate as illustrated in FIG. 5H. Finally, the etching resist 4 is removed to form a thermopile as illustrated in FIG. 5I. The state illustrated in FIG. 5I is the same as the state illustrated in FIG. 3. That is, each of FIG. 5I and FIG. 3 is an enlarged view showing the section taken along the line III—III in FIG. 1. Protecting layers may be formed on both surfaces of the thermopile, and the thermopile may be formed into a desirable shape.

Figure 4:
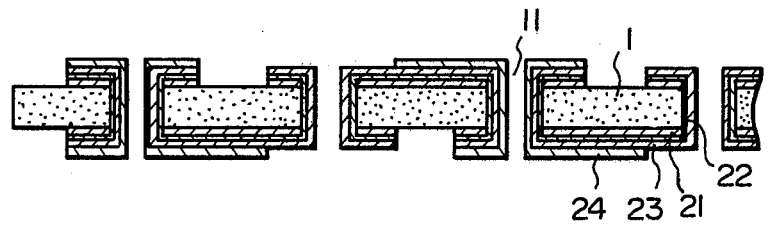
FIG. 4 is an enlarged end view showing the section taken along the line IV—IV in FIG. 1.
Figure 5A:
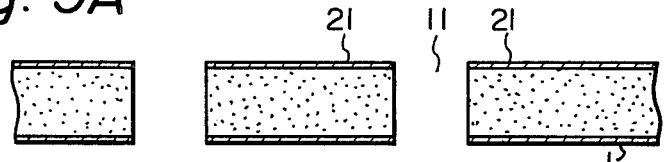
FIGS. 5A through 5I are enlarged sectional views illustrating the steps of one embodiment of the process for manufacturing a thermopile according to the invention; and, FIGS. 6A through 6J are enlarged sectional views illustrating the steps of another embodiment of a process for manufacturing a thermopile according to the invention.
Figure 5B:
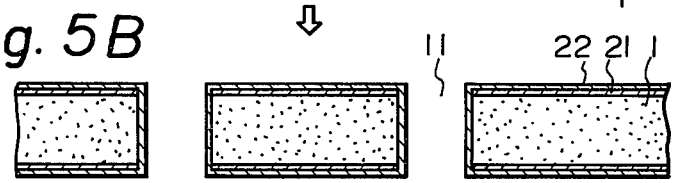
Figure 5C:
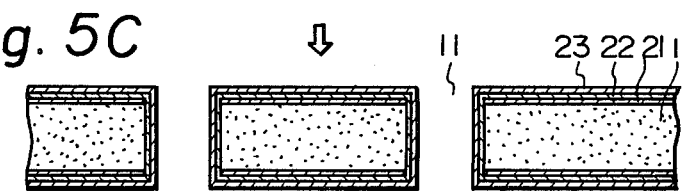
Figure 5D:
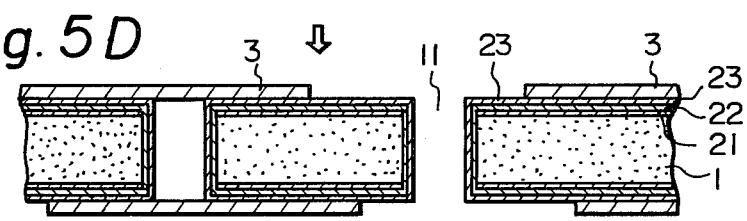
Figure 5E:
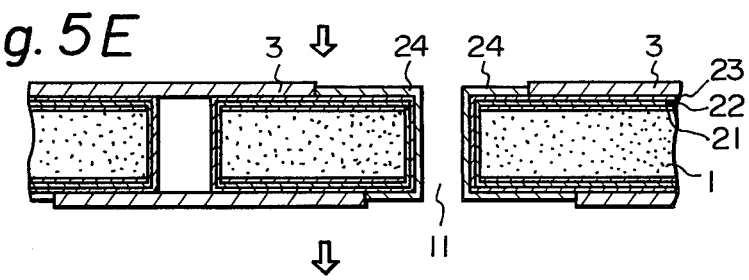
Figure 5F:
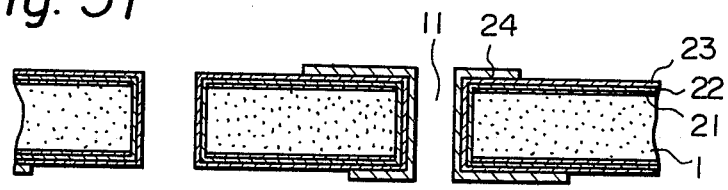
Figure 5G:
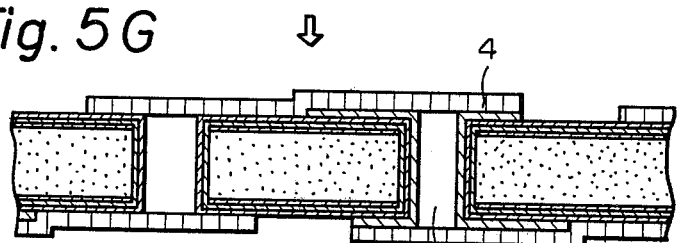
Figure 5H:
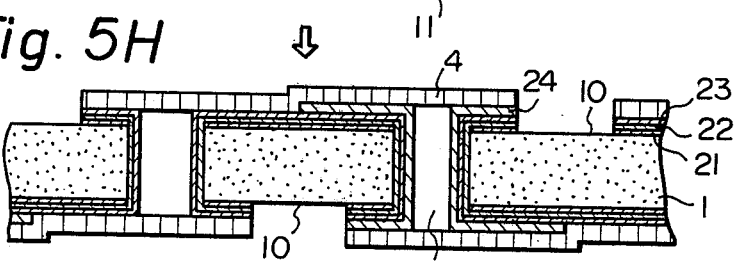
Figure 5I:
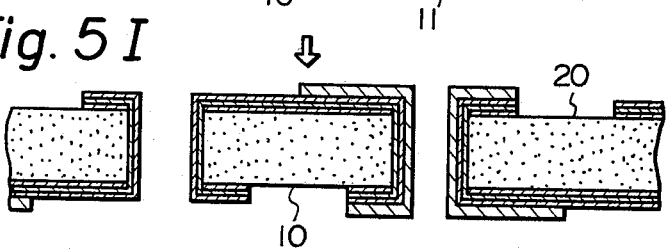
Figure 6A:
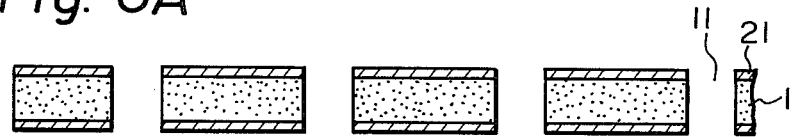
Figure 6B:
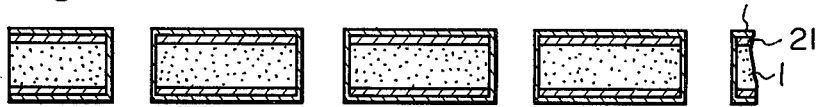
Figure 6C:
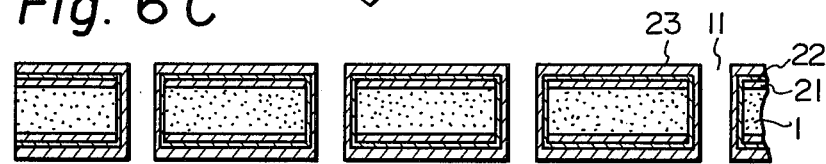
Figure 6D:
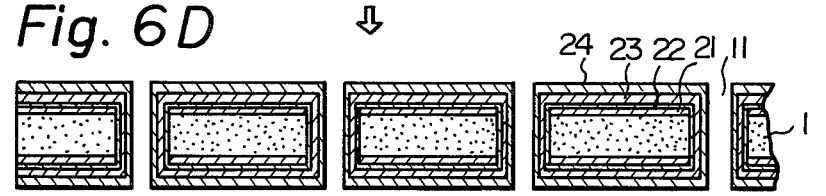
Figure 6E:
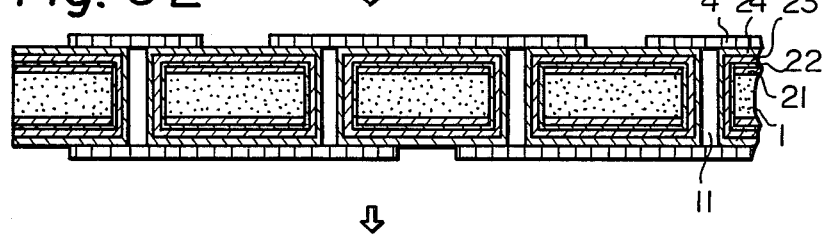
Figure 6F:
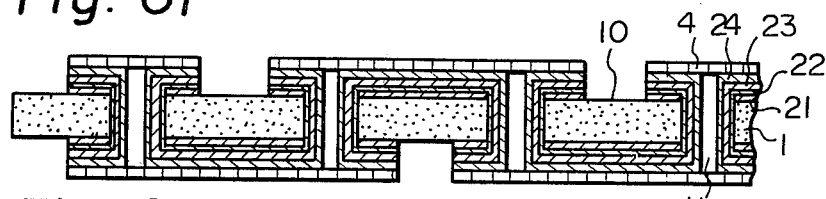
Figure 6G:
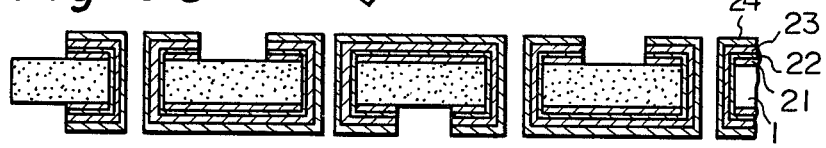
Figure 6H:
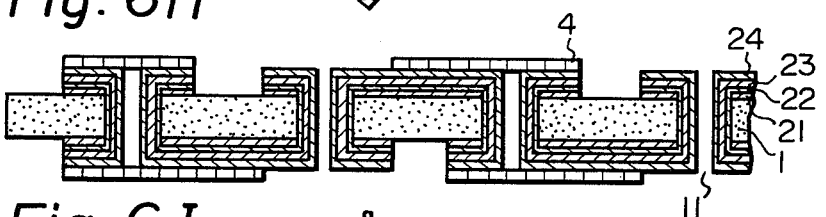
Figure 6I:
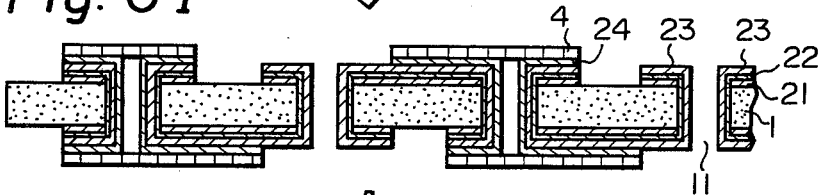
Figure 6J:
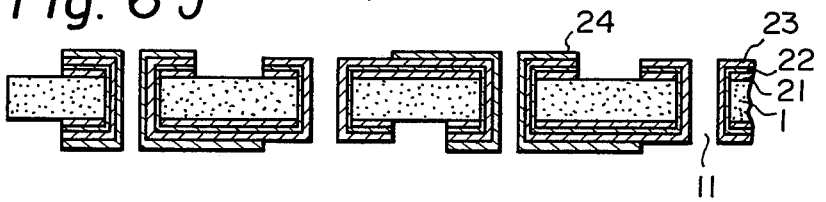

FIGS. 6A through 6C illustrate the same steps as illustrated in FIGS. 5A through 5C, that is the step of forming through holes 11 in a substrate 1 having copper foils 21 bonded to both surfaces thereof, the step of forming an electroless copper plating layer 22 and the step of forming a layer 23 of nickel as one metal by electroplating, respectively. In FIG. 6D, a layer 24 of copper as the other metal is then formed on the entire surface of the nickel plating layer 23 by electroplating of copper. Then, an etching resist 4 for removing unnecessary portions of these metal layers is formed and etching is carried out to form discontinuous portions 10 in FIGS. 6E and 6F respectively. The etching resist 4 is removed as in FIG. 6G. Subsequently, in order to remove unnecessary portions of the layer 24 of copper as the other metal, an etching resist having a pattern corresponding to the desired pattern of the copper layer 24 is formed as in FIG. 6H and the predetermined portions of the copper layer 24 are removed by an appropriate etching sulution such as an ammonia type alkali etchant or an ammonium persulfate etchant. Layer 23 of nickel as one metal is exposed in the copper-removed portions as in FIG. 6I. After the etching resist 4 is removed as illustrated in FIG. 6J, an enlarged end view showing the section taken along the line IV—IV in FIG. 1, a thermopile as illustrated in FIG. 4 is obtained. Such thermopile may be subjected to a protecting layer-forming treatment and/or another processing treatment.

While the invention has been particularly shown and described with reference to preferred embodiments thereof, it will be understood by those skilled in the art that various changes in form and details may be made therein without departing from the spirit and scope of the invention.

We claim:

1. A thermopile comprising a plurality of thermocouples which are composed of segments of a first metal and segments of a second metal, said segments of different metals being connected to one another alternately so that the thermocouples are arranged in series on a heat-resistant, electrically non-conductive substrate, wherein each segment comprises a portion plated on one surface of the substrate, a portion plated on the other surface of the substrate and a portion plated on the inner wall of through holes formed in the substrate to connect the two portions plated on the two surfaces of the substrate with each other.

2. A thermopile as claimed in claim 1, wherein said through holes are arranged in a checker-like pattern in the substrate and said segments of different metals are connected to one another alternately so that they form a zigzag pattern on the surfaces of the substrate.

3. A thermopile as claimed in claim 1 or 2, wherein one metal is nickel and the other metal is copper.

4. A process for manufacturing a thermopile comprising a plurality of thermocouples which are composed of segments of a first metal and segments of a second metal, said segments of different metals being connected to one another alternately so that the thermocouples are arranged in series on a heat-resistant, electrically non-conductive substrate, wherein each segment comprises a portion plated on one surface of the substrate, a portion plated on the other surface of the substrate and a portion plated on the inner wall of through holes formed in the substrate to connect the two portions plated on the two surfaces of the substrate with each other, which process comprises the steps of:
 (a) forming a plurality of through holes in the heat-resistant, electrically non-conductive substrate at predetermined positions;
 (b) subjecting the inner walls of said through holes and both the surfaces of the substrate to electroless plating;
 (c) plating the entire surface of said electroless plating layer with the first metal;
 (d) forming on the plating layer of the first metal a plating resist covering the plating layer of the first metal except regions corresponding to the portions of the segments of the second metal to be formed thereon and to the openings of the plated through holes opening in said portions;
 (e) plating the resist-formed substrate with the second metal by using the plating resist as a mask;
 (f) removing the plating resist;
 (g) forming on the composite plating layer of the two metals an etching resist covering only regions corresponding to the portions of the segments of the two metals to be formed on the surfaces of the substrate and to the openings of the plated through holes opening in said portions;

(h) performing etching by using the etching resist as a mask; and, (i) removing the etching resist.

5. A process for manufacturing a thermopile comprising a plurality of thermocouples which are composed of segments of a first metal and segments of a second metal, said segments of different metals being connected to one another alternately so that the thermocouples are arranged in series on a heat-resistant, electrically non-conductive substrate, wherein each segment comprises a portion plated on one surface of the substrate, a portion plated on the other surface of the substrate and a portion plated on the inner wall of through holes formed in the substrate to connect the two portions plated on the two surfaces of the substrate with each other, which process comprises the steps of:

(a) forming a plurality of through holes in the heat-resistant, electrically non-conductive substrate at predetermined positions;

(b) subjecting the inner walls of said through holes and both the surfaces of the substrate to electroless plating;

(c) plating the entire surface of said electroless plating layer with the first metal;

(d) plating the entire surface of the first metal plating layer with the second metal;

(e) forming on the composite plating layer of the two metals a first etching resist covering only regions corresponding to the portions of the segments of the two metals to be formed on the surfaces of the substrate and to the openings of the plated through holes opening in said portions;

(f) performing etching by using the first etching resist as a mask;

(g) removing the first etching resist;

(h) forming on the remaining composite plating layer a second etching resist covering regions corresponding to the portions of the segments of the second metal to be formed on the surfaces of the substrate and to the openings of the plated through holes opening formed in said portions;

(i) performing etching by using the second etching resist as a mask to expose the first metal at predetermined portions; and, (j) removing the second etching resist.

6. A process as claimed in claim 4 or 5, wherein the first metal is nickel and the second metal is copper.

* * * * *